(12) United States Patent
Kousai et al.

(10) Patent No.: US 6,476,639 B2
(45) Date of Patent: Nov. 5, 2002

(54) SEMICONDUCTOR INTEGRATED CIRCUIT DEVICE CAPABLE OF PRODUCING OUTPUT THEREOF WITHOUT BEING INFLUENCED BY OTHER INPUT

(75) Inventors: Shouhei Kousai, Yokohama (JP); Mototsugu Hamada, Yokohama (JP); Tadahiro Kuroda, Tokyo-To (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/788,413

(22) Filed: Feb. 21, 2001

(65) Prior Publication Data

US 2001/0015658 A1 Aug. 23, 2001

(30) Foreign Application Priority Data

Feb. 22, 2000 (JP) .......................................... 2000-44307

(51) Int. Cl.⁷ ..................... H03K 19/0175; H03K 19/20
(52) U.S. Cl. .......................................... 326/82; 326/119
(58) Field of Search ..................... 326/82–83, 104–106, 326/108, 119, 121, 122

(56) References Cited

U.S. PATENT DOCUMENTS

| 4,803,665 | A | * | 2/1989 | Kasa ........................ 365/233.5 |
| 5,391,941 | A | * | 2/1995 | Landry ........................ 326/106 |
| 5,793,551 | A | * | 8/1998 | Ngo et al. ..................... 360/67 |

FOREIGN PATENT DOCUMENTS

JP  10-308450  11/1998

* cited by examiner

Primary Examiner—Michael Tokar
Assistant Examiner—James H. Cho
(74) Attorney, Agent, or Firm—Oblon, Spivak, McClelland, Maier & Neustadt, P.C.

(57) ABSTRACT

A semiconductor integrated circuit device is capable of producing an output without being influenced by the other input. The semiconductor integrated circuit device includes a logic circuit designed to process a predetermined logical operation on the basis of an input signal, and an input capacitance equalizing circuit designed to equalize the input capacitance of the logical circuit.

5 Claims, 14 Drawing Sheets

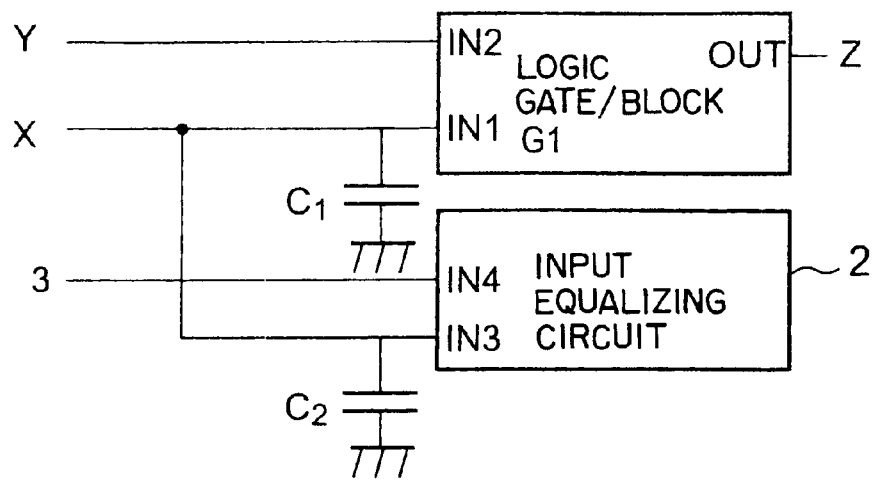
F I G. 3
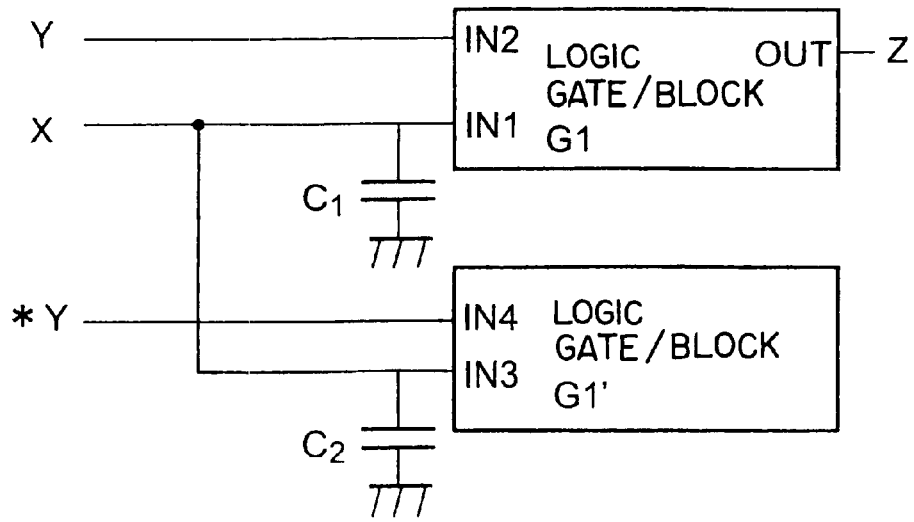
F I G. 4

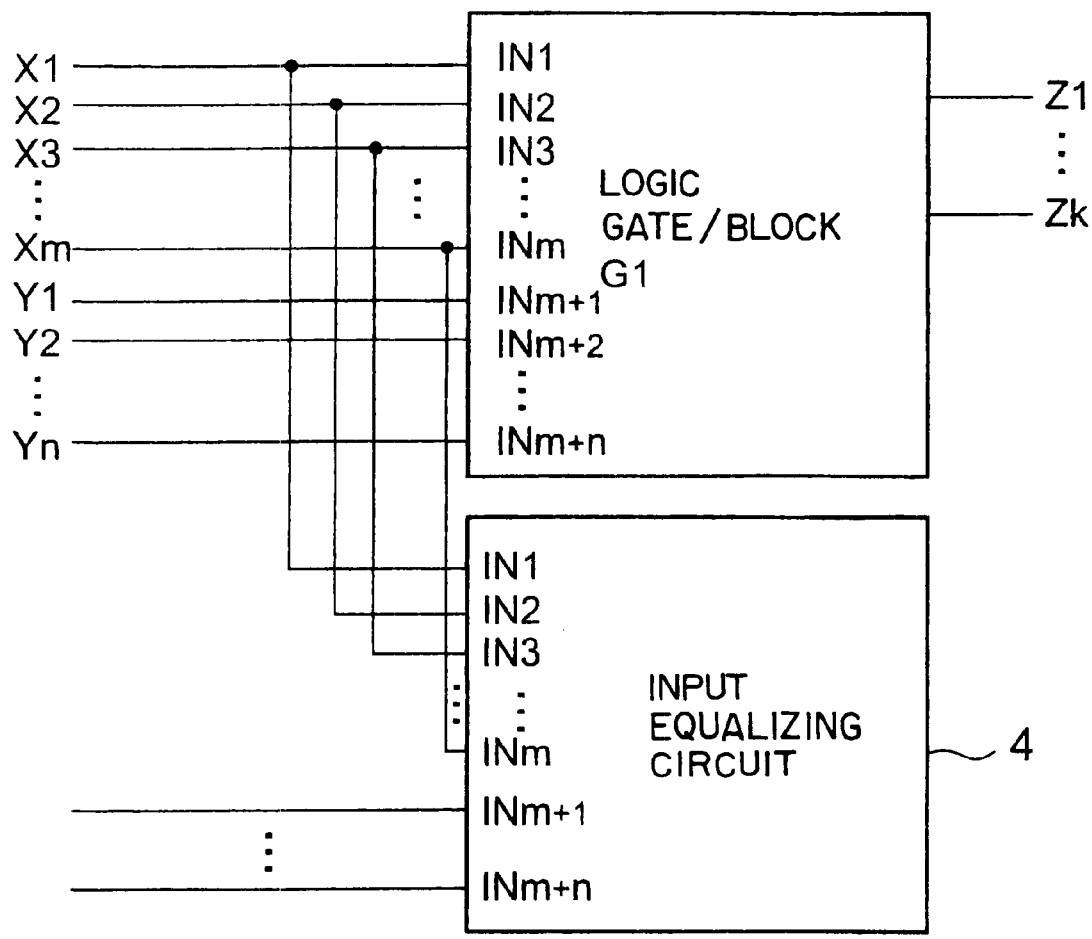
F I G. 5

SEMICONDUCTOR INTEGRATED CIRCUIT DEVICE CAPABLE OF PRODUCING OUTPUT THEREOF WITHOUT BEING INFLUENCED BY OTHER INPUT

CROSS REFERENCE TO RELATED APPLICATION

This application claims benefit of priority under 35 U.S.C. §119 to Japanese Patent Application No. 2000-44307, filed on Feb. 22, 2000, the entire contents of which are incorporated by reference herein.

BACKGROUND OF THE INVENTION

The present invention relates generally to a semiconductor integrated circuit device. More specifically, the invention relates to a semiconductor integrated circuit device capable of producing an output thereof without being influenced by other input/inputs, by improving how to construct a logic gate constituting a clock tree.

The delay time of a signal propagated in an integrated circuit is determined by the input capacitance of a logic gate serving as a load. The input capacitance, i.e., the delay time, in a circuit having a multi-input gate as a load is under the influence of the state of another input signal of the multi-input gate. FIG. 1 shows a circuit having a two-input NAND gate as a load. In FIG. 1, although the input capacitance viewed from an input terminal is (C1+C2), the input capacitance C1 of the NAND gate is influenced by the state of another input A.

That is, the apparent capacitance C1 varies in accordance with the high or low state of the input A. As a result, the delay time of a signal transmitted from the input terminal in to an output terminal out varies. Conventionally, in such a case, a timing design is carried out by supposing the state of the input A in which the delay time of the signal transmitted from the input terminal in to the output terminal out is maximum. In this case, there is a problem in that margin is largish by estimating excessive delay time. In addition, there is some possibility that it is required to suppose the state of the input A, in which the delay time is minimum, to separately carry out a timing check.

Particularly in a clock tree for distributing clock signals to the whole LSI (Large Scale Integrated circuit), it is required to precisely carry out a timing design. In recent years, in order to reduce the electric power consumption of LSIs, there has been used a gated clock technique for partially stopping the supply of clock signals if necessary, such as the art disclosed in Japanese Patent Laid-Open No. 10-308450. FIG. 2 shows an example of a construction of a gated clock circuit which is disclosed as the prior art in FIG. 5 of the above described publication. In this circuit, clock signals are inputted as signals 58a and 58b from a root buffer 51 to NOR circuits 52a and 52b serving as multi-input gates. When the level of a signal 56a or 56b outputted from a selector circuit 57 is low, the clock signal is transmitted to a buffer circuit in the next stage, whereas when the level of the signal 56a or 56b is high, the level of the output is always low, so that the clock signal is not transmitted. Thus, the electric power consumption is reduced by stopping the excessive transition of the clock buffer by the output from the selector circuit 57.

There is generally no correlation between the operations of logical blocks 60A and 60B, so that it is possible to set any combinations of the states of the output signals 56a and 56b from the selector circuit 57. Viewed from the root buffer 51, the input capacitance of the NOR circuit 52a and the input capacitance of the NOR circuit 52b depend on the states of the signals 56a and 56b, respectively. For example, the timing in outputting a signal from the NOR circuit 52a is different between when the level of the signal 56b is high and low. Therefore, the timings in inputting clock signals to flip-flop circuits 55a are different.

In general, LSIs are designed so as to operate without causing the shift of all of clock signals inputted to flip-flop circuits 55a and 55b. The shift of clock signals is called clock skew which must be as small as possible. In the gated clock circuit shown in FIG. 2, the input capacitance of the clock signal of the two-input OR-gate of each of the NOR circuit 52a and 52b is different from each other in accordance with the state of the signal outputted from the selector circuit 57. Therefore, if the circuit is designed so as to decrease the clock skew by assuming the state of a specific signal of the selector circuit, the clock skew increases in another state.

Thus, it is impossible to carry out a timing design capable of decreasing clock skews in all states. As can be clearly seen from the contents disclosed in FIGS. 1 and 3 serving as preferred embodiments in the above described Japanese Patent Laid-Open No. 10-308450, this problem on timing design has not been solved.

SUMMARY OF THE INVENTION

It is therefore an object of the present invention to provide a semiconductor integrated circuit device capable of designing a logic circuit so that a delay time of a signal propagated in an integrated circuit can be precisely estimated.

In order to accomplish the above object, according to a first basic construction of the present invention, there is provided a semiconductor integrated circuit device capable of producing an output thereof without being influenced by the other inputs, the semiconductor integrated circuit device comprising: a logic circuit designed to process a predetermined logical operation on the basis of an input signal; and an input capacitance equalizing circuit designed to equalize the input capacitance of the logical circuit.

According to a second basic construction of the present invention, there is provided a semiconductor integrated circuit device capable of generating an output thereof without being influenced by the other inputs, the semiconductor integrated circuit device comprising: a logic circuit designed to process a predetermined logical operation on the basis of an input signal; and input capacitance equalizing circuit designed to equalize the input capacitance of the logical circuit, wherein the logic circuit comprises a first logic circuit for carrying out a predetermined logical operation on the basis of a first input signal, and a second logic circuit for carrying out a predetermined logical operation on the basis of at least a second input signal, and an input capacitance equalizing circuit comprises an input capacitance equalizing circuit to which the first input signal is inputted, and wherein the first logic circuit has one or a plurality of the same circuit constructions which are operated by the first input signal, the second logic circuit has one or a plurality of the same circuit constructions to which the one or plurality of second input signals and an output signal outputted from the input capacitance equalizing circuit are inputted, and the input capacitance equalizing circuit is a making input capacitance independence circuit for equalizing the input capacitance of the first input signal without depending on the state of the second input signals.

BRIEF DESCRIPTION OF THE DRAWINGS

In the drawings:

FIG. 3 is a block diagram showing the construction of the first preferred embodiment of a semiconductor integrated circuit device according to the present invention;

FIG. 4 is a block diagram showing the construction of the second preferred embodiment of a semiconductor integrated circuit device according to the present invention;

FIG. 5 is a block diagram showing the construction of the third preferred embodiment of a semiconductor integrated circuit device according to the present invention;

DESCRIPTION OF THE PREFERRED EMBODIMENTS

Figure 1:
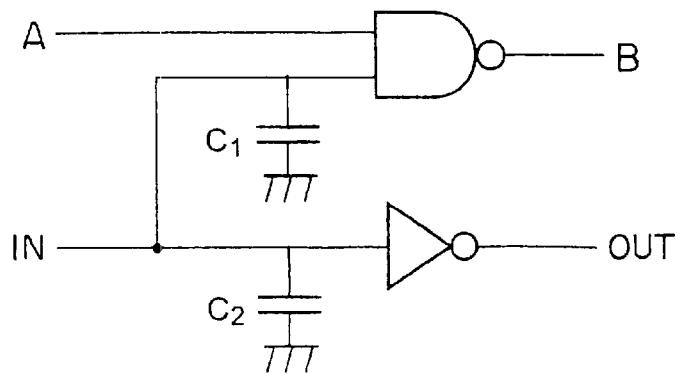
FIG. 1 is a logical block diagram showing the construction of a conventional semiconductor integrated circuit device.

Referring now to the accompanying drawings, the preferred embodiments of the present invention will be described below. Referring to FIGS. 3 through 22, the first through twentieth preferred embodiments of a semiconductor integrated circuit device according to the present invention will be described. The first gist of the present invention is characterized in that, in a logic circuit which has a plurality of inputs and wherein the signal states of the plurality of inputs are different to cause the difference in capacitance between their input pins, one or more of the inputs of the logic circuit having the plurality of inputs are provided with a capacitance equalizing circuit for fixing the input capacitance of the input(s) regardless of the states of the plurality of inputs. Therefore, concrete logic circuits comprising multistage logic elements may include any clock tree circuits, logic gates and logical blocks. Each of the preferred embodiments will be described below.

First Preferred Embodiment

Referring to FIG. 3, the first preferred embodiment of a semiconductor integrated circuit device according to the present invention will be described. When a two-input logic gate or a block G1 comprising the logic gate has inputs IN1 and IN2, an input equalizing circuit 2 is constructed so that the sum (C1+C2) of the input capacitance of an IN1 terminal of the block G1, to which an input signal X is inputted, and the input capacitance of an IN3 terminal of an input capacitance equalizing circuit is always constant regardless of the state of an input signal Y.

As a result, the input capacitance viewed from the input signal X can be constant. There are some cases where the input of the input capacitance equalizing circuit 2 is not only the input X, and another input 3 is supplied to an input terminal IN4 as shown in the figure. By using the first preferred embodiment of a semiconductor integrated circuit device according to the present invention, it is possible to prevent the input capacitance of one input, which is inputted to the two-input gate, from being influenced by the state of another input signal.

Second Preferred Embodiment

Referring to FIG. 4, the second preferred embodiment of a semiconductor integrated circuit device according to the present invention will be described below. In this second preferred embodiment, the input capacitance equalizing circuit 2 in the first preferred embodiment shown in FIG. 3 comprises a two-input logic gate equivalent to the block G1, or a block G1' comprising the logic gate.

The block G1 has an input terminal IN1 to which a signal X is inputted, an input terminal IN2 to which a signal Y is inputted, and an output terminal OUT to which a signal Z is outputted. The block G' has an input terminal IN3 to which the signal X is inputted, and an input terminal IN4 to which the inverted signal *Y of the signal Y is inputted. Reference signs C1 and C2 denote input capacitance to the input terminal IN1 of the block G1 and the input terminal IN3 of the block G1'. It is effective that the circuit parameters of the block G' serving as the equalizing circuit are equal to the circuit parameters of the block G1. Throughout the specification, sign "*" is used as an inverted sign.

By using the second preferred embodiment of a semiconductor integrated circuit device according to the present invention, it is possible to prevent the input capacitance of one input, which is inputted to the two-input gate, from being influenced by the state of another input signal.

Third Preferred Embodiment

Referring to FIG. 5, the third preferred embodiment of a semiconductor integrated circuit device according to the present invention will be described below. In a logical block having (m+n) input terminals IN1 through INm+n to which (m+n) signals including signals X1 through Xm and signals Y1 through Yn are inputted, respectively, an input capacitance equalizing circuit 4 is constructed so that the input capacitances of the input terminals IN1 through INm are constant regardless of the states of the input signals Y1 through Yn. The case where m=1 and n=1 corresponds to the first preferred embodiment.

In this third preferred embodiment, the block G1 may output a plurality of output signals Z1 through Zk. The inputs of the input equalizing circuit 4 should not be limited to X1 through Xm.

By using the third preferred embodiment of a semiconductor integrated circuit device according to the present invention, it is possible to prevent the input capacitance of at least one input, which is inputted to the multi-input gate, from being influenced by the state of some input signals of other input signals.

Fourth Preferred Embodiment

Figure 6:
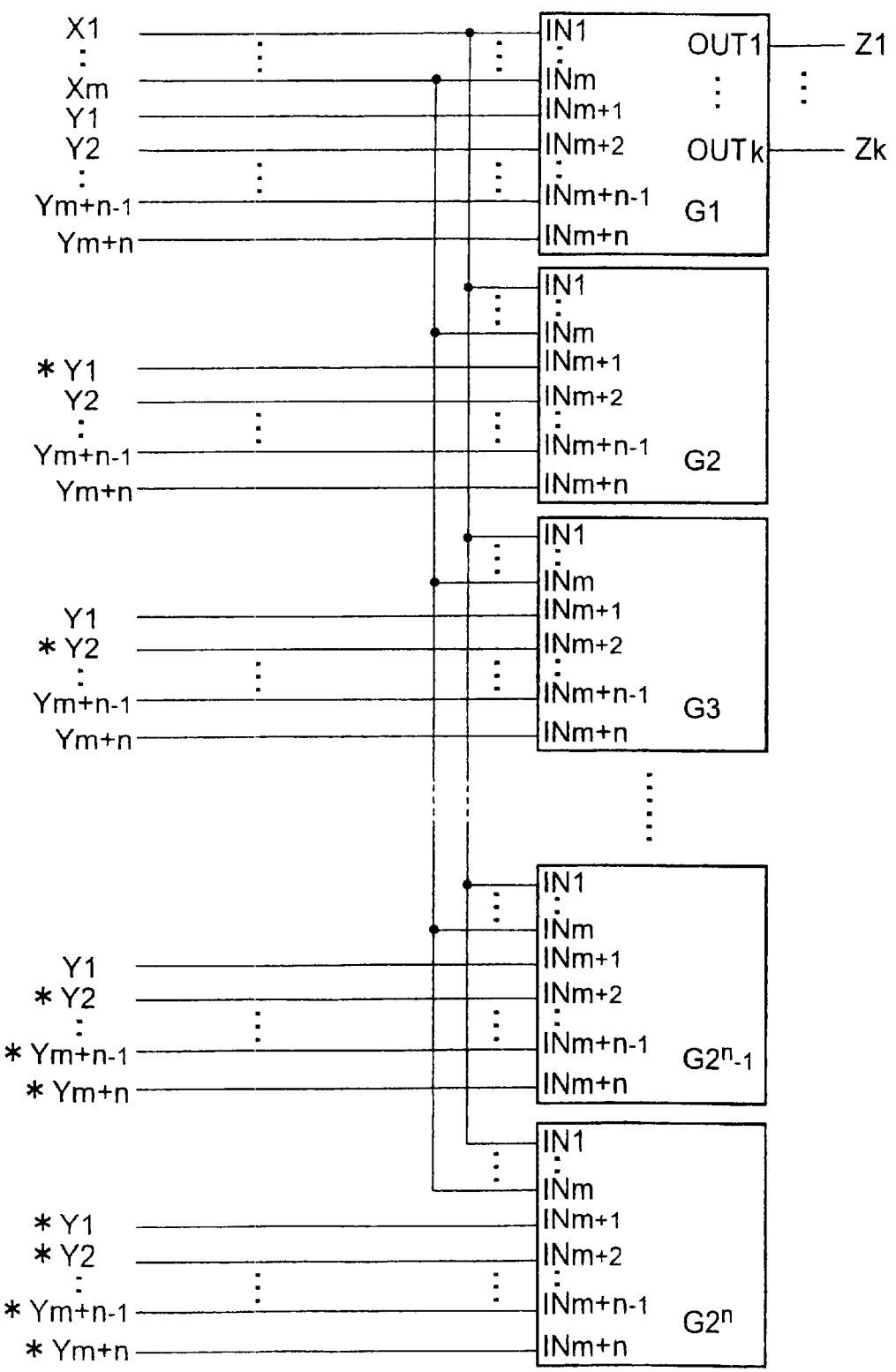
FIG. 6 is a block diagram showing the construction of the fourth preferred embodiment of a semiconductor integrated circuit device according to the present invention.

Referring to FIG. 6, the fourth preferred embodiment of a semiconductor integrated circuit device according to the present invention will be described below. In this circuit device in the fourth preferred embodiment, the input equalizing circuit in the circuit device in the third preferred embodiment comprises logic gates which are equivalent to a logic gate G1, or equivalent blocks G2 through $G2^n$ which comprise logical gates. In this case, it is required to provide $2^n$ logic gates or blocks.

By using the fourth preferred embodiment of a semiconductor integrated circuit device according to the present invention, it is possible to prevent the input capacitance of at least one input, which is inputted to the multi-input gate, from being influenced by the state of some input signals of other input signals.

Fifth Preferred Embodiment

Figure 7:
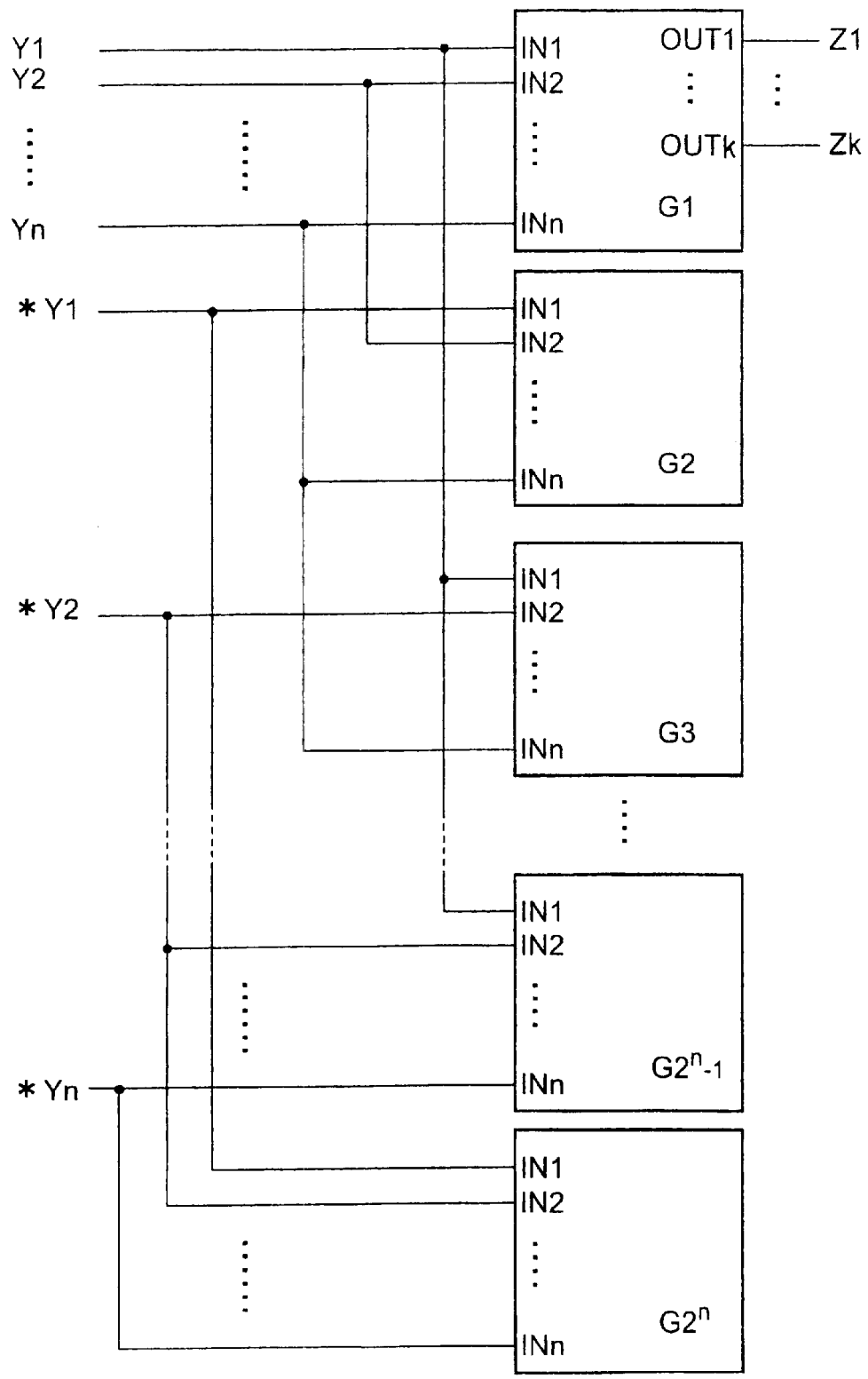
FIG. 7 is a block diagram showing the construction of the fifth preferred embodiment of a semiconductor integrated circuit device according to the present invention.

Referring to FIG. 7, the fifth preferred embodiment of a semiconductor integrated circuit device according to the present invention will be described below. This circuit device in the fifth preferred embodiment is an example where the input X1 through Xm of the circuit device in the fourth preferred embodiment do not exist. In this case, there are n input signals Y1 through Yn, and a logic gate or logical block G1 has n inputs.

Similar to the fourth preferred embodiment, the input capacitance equalizing circuit comprises logic gates which are equivalent to a logic gate G1, or equivalent blocks G2 through $G2^n$ which comprise logic gates.

In this case, the input capacitances viewed from n input signals Y1 through Yn are constant regardless of the states of all of other input signals. In this case, the block $G2^n$ to which only the inverted signals of Y1 through Yn are inputted may be omitted.

By using the fifth preferred embodiment of a semiconductor integrated circuit device according to the present invention, it is possible to prevent the input capacitance viewed from all of input signals, which are inputted to the multi-input gate, from being influenced by the states of all of other input signals.

Sixth Preferred Embodiment

Figure 8:
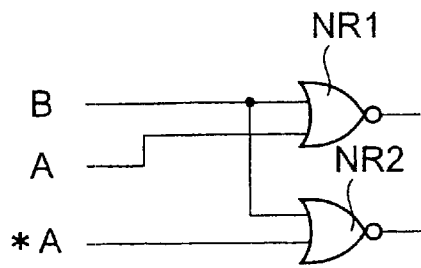
FIG. 8 is a circuit diagram showing the construction of the sixth preferred embodiment of a semiconductor integrated circuit device according to the present invention.

Referring to FIG. 8, the sixth preferred embodiment of a semiconductor integrated circuit device according to the present invention will be described below. The semiconductor integrated circuit in this sixth preferred embodiment is designed to fix the capacitance of one input pin of a two-input NOR circuit regardless of the state of another input signal. The semiconductor integrated circuit comprises a first two-input NOR circuit NR1 to which signals A and B are inputted, and a second two-input NOR circuit NR2 to which the inverted signal *A of the signal A and the signal B are inputted. The signal *A is suitably generated by an inverter circuit or the like. The other input of the first NOR circuit NR1 is complementary to the other input signal of the second NOR circuit NR2. In other words, when the potential of the signal A is in a high state, the potential of the signal *A is a low state, and when the potential of the signal A is in a low state, the potential of the signal *A is a high state. That is, viewed from the signal B, one two-input NOR circuit, the outer input of which is in a high state, and one two-input NOR circuit, the other input of which is in a low state exist regardless of the state of the signal A, so that the input capacitance is constant regardless of the state of the signal A.

It is effective that the circuit parameters of the first and second NOR circuits NR1 and NR2 approximate to each other. It is also effective that the magnitude of the load to the output of the second NOR circuit approximates to the magnitude of the output load of the first NOR circuit. While the two-input NOR circuits have been used in the sixth preferred embodiment, the present invention may be applied to other two-input logic circuits.

According to the semiconductor integrated circuit device in the sixth preferred embodiment with the above described construction, it is possible to prevent the input capacitance of one input pin of a two-input logic circuit from being influenced by the state of another input signal.

Seventh Preferred Embodiment

Figure 9:
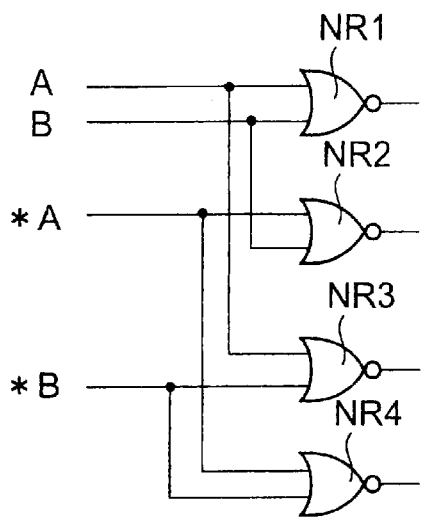
FIG. 9 is a circuit diagram showing the construction of the seventh preferred embodiment of a semiconductor integrated circuit device according to the present invention.

Referring to FIG. 9, the seventh preferred embodiment of a semiconductor integrated circuit device according to the present invention will be described below. In this seventh preferred embodiment, the input pin capacitances of two input pins of a two-input NOR circuit are fixed regardless of the state of the input signal of the other input pin. The semiconductor integrated circuit device in the seventh preferred embodiment comprises first through fourth two-input NOR circuits NR1, NR2, NR3 and NR4. Signals A and B are inputted to the first NOR circuit NR1, and the inverted signal *A of the signal A and the signal B are inputted to the second NOR circuit NR2. The signal A and the inverted signal *B of the signal B are inputted to the third NOR circuit NR3, and the inverted signal *A of the signal A and the inverted signal *B of the signal B are inputted to the fourth NOR circuit NR4. The inverted signals *A and *B can be generated by inverters or the like, if necessary.

Viewed from the input A, loads are the first and third NOR circuits NR1 and NR3. The other inputs of the first and third NOR circuits NR1 and NR3 are the signal B and the signal *B, respectively, and the pin capacitance of the input A is constant regardless of the state of the signal B. If the inverter for generating the signal * A exists in addition thereto, its capacitance is added. Then, viewed from the input B, loads are the first and second NOR circuits NR1 and NR2. The other inputs of the first and second NOR circuits NR1 and NR2 are the signal A and the signal *A, and the input pin capacitance of the input B is constant regardless of the state of the signal A. If the inverter for generating the signal *B exists in addition thereto, its capacitance is added.

Since the output of the two-input NOR circuit is now originally required, the output of the first NOR circuit NR1 is connected to a circuit in the next stage. It is herein more effective that the output loads of the second through fourth NOR circuits NR2, NR3 and NR4 are the same as that of the first NOR circuit. It is also effective that the circuit parameters of the first through fourth NOR circuits NR1 through NR4 approximate to each other. The fourth NOR circuit NR4 may be omitted. While the two-input NOR circuits have been used in the seventh preferred embodiment, the present invention may be applied to other two-input logic circuits.

By using the seventh preferred embodiment of a semiconductor integrated circuit device according to the present invention, it is possible to prevent the input capacitance of an optional one input pin of a two-input logic circuit from being influenced by the state of another input signal.

Eighth Preferred Embodiment

Figure 10:
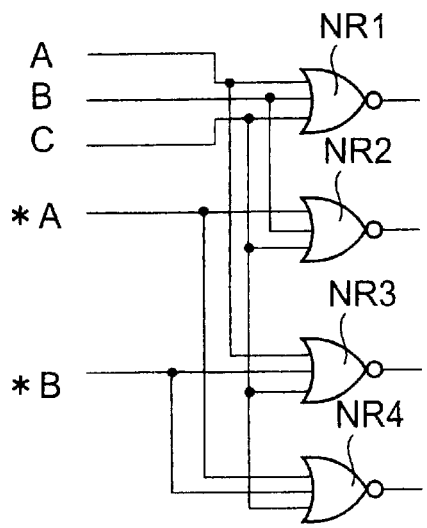
FIG. 10 is a circuit diagram showing the construction of the eighth preferred embodiment of a semiconductor integrated circuit device according to the present invention.

Referring to FIG. 10, the eighth preferred embodiment of a semiconductor integrated circuit device according to the present invention will be described below. This eighth preferred embodiment is an example where the circuit device in the seventh preferred embodiment is applied to three-input logic circuits. The semiconductor integrated circuit device in the eighth preferred embodiment comprises first through fourth three-input NOR circuits NR1 through NR4. Signals A, B and C are inputted to the first NOR circuit NR1. The inverted signal *A of the signal A, the signal B and the signal C are inputted to the second NOR circuit NR2. The signal A, the inverted signal *B of the signal B and the signal C are inputted to the third NOR circuit NR3.

The inverted signal *A of the signal A, the inverted signal * B of the signal B and the signal C are inputted to the fourth NOR circuit NR4. Viewed from the signal C, regardless of the states of the signals A and B, the three-input NOR circuit, the first input of which is in a high state and the second input of which is in a high state, the three-input NOR circuit, the first input of which is in a high state and the second input of which is a low state, the three-input NOR circuit, the first input of which is a low state and the second input of which is in a high state, and the three-input NOR circuit, the first input of which is a low state and the second input of which is in a low state, serve as loads. As a result, the input pin capacitance of the input C is always held to be constant.

Since the output of the three-input NOR circuit is now originally required, the output of the first NOR circuit NR1 is connected to a circuit in the next stage. It is herein more effective that the output loads of the second through fourth NOR circuits NR2, NR3 and NR4 are the same as that of the first NOR circuit. It is also effective that the circuit parameters of the first through fourth NOR circuits NR1 through NR4 approximate to each other. While the three-input NOR circuits have been used in the eighth preferred embodiment, the present invention may be applied to other three-input logic circuits.

By using the eighth preferred embodiment of a semiconductor integrated circuit device according to the present invention, it is possible to prevent the input capacitance of an optional one input pin of a three-input logic circuit from being influenced by the state of another input signal.

Ninth Preferred Embodiment

Figure 11:
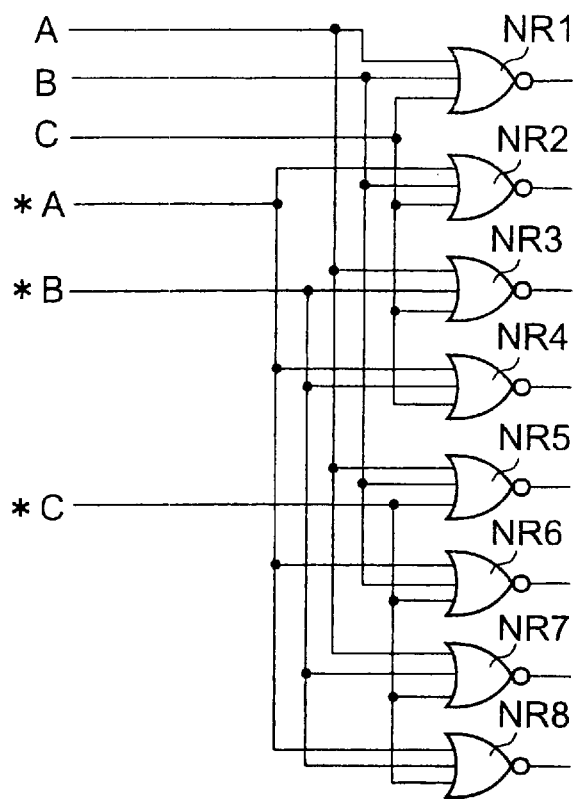
FIG. 11 is a circuit diagram showing the construction of the ninth preferred embodiment of a semiconductor integrated circuit device according to the present invention.

Referring to FIG. 11, the ninth preferred embodiment of a semiconductor integrated circuit device according to the present invention will be described below. The circuit device in the ninth preferred embodiment is an example where the circuit device in the seventh preferred embodiment is applied to three-input logic circuits. The semiconductor integrated circuit device in the ninth preferred embodiment comprises first through eighth three-input NOR circuits NR1 through NR8. Signals A, B and C are inputted to the first NOR circuit NR1. The inverted signal *A of the signal A, the signal B and the signal C are inputted to the second NOR circuit NR2. The signal A, the inverted signal *B of the signal B and the signal C are inputted to the third NOR circuit NR3. The inverted signal *A of the signal A, the inverted signal *B of the signal B and the signal C are inputted to the fourth NOR circuit NR4.

The signal A, the signal B and the inverted signal *C of the signal C are inputted to the fifth NOR circuit NR5. The inverted signal *A of the signal A, the signal B and the inverted signal *C of the signal C are inputted to the sixth NOR circuit NR6. The signal A, the inverted signal *B of the signal B and the inverted signal *C of the signal C are inputted to the seventh NOR circuit NR7. The inverted signal *A of the signal A, the inverted signal *B of the signal B and the inverted signal * C of the signal C are inputted to the eighth NOR circuit NR8.

Viewed from the signal C, regardless of the states of the signals A and B, the three-input NOR circuit, the first input of which is in a high state and the second input of which is in a high state, the three-input NOR circuit, the first input of which is in a high state and the second input of which is a low state, the three-input NOR circuit, the first input of which is a low state and the second input of which is in a high state, and the three-input NOR circuit, the first input of which is a low state and the second input of which is in a low state, serve as loads. When the inverted signal *C of the signal C is generated by an inverter, the inverter capacitance is added thereto. As a result, the input pin capacitance of the input C is always held to be. constant. This is the same with respect to the inputs A and B.

Since the output of the three-input NOR circuit is now originally required, the output of the first NOR circuit NR1 is connected to a circuit in the next stage. It is herein more effective that the output loads of the second through eighth NOR circuits NR2 through NR8 are the same as that of the first NOR circuit. It is also effective that the circuit parameters of the first through eighth NOR circuits NR1 through NR8 approximate to each other. While the three-input NOR circuits have been used in the ninth preferred embodiment, the present invention may be applied to other three-input logic circuits. The eighth NOR circuit NR8 may be omitted.

By using the ninth preferred embodiment of a semiconductor integrated circuit device according to the present invention, it is possible to prevent the input capacitances of all of the input pins of a three-input logic circuit from being influenced by the state of another input signal.

Tenth Preferred Embodiment

Figure 12:
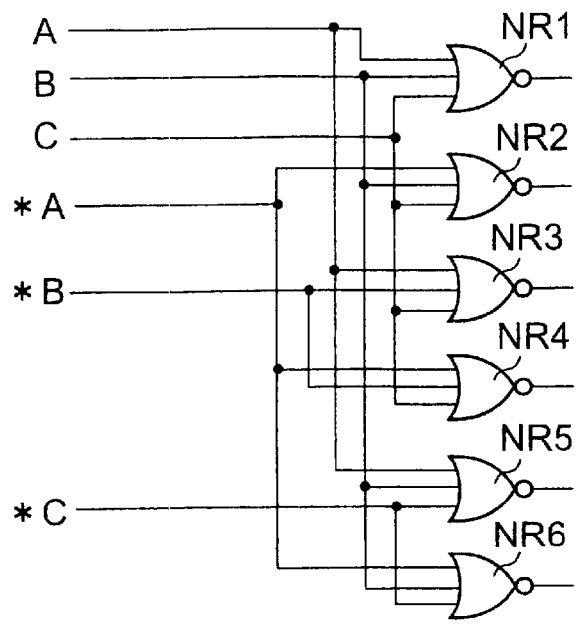
FIG. 12 is a circuit diagram showing the construction of the tenth preferred embodiment of a semiconductor integrated circuit device according to the present invention.

Referring to FIG. 12, the tenth preferred embodiment of a semiconductor integrated circuit device according to the present invention will be described below. The circuit device in the tenth preferred embodiment is an example where the input pin capacitance is equalized with respect to two input signals of three input signals. The semiconductor integrated circuit device in the tenth preferred embodiment comprises first through sixth three-input NOR circuits NR1 through NR6. Signals A, B and C are inputted to the first NOR circuit NR1. The inverted signal *A of the signal A, the signal B and the signal C are inputted to the second NOR circuit NR2. The signal A, the inverted signal *B of the signal B and the signal C are inputted to the third NOR circuit NR3. The inverted signal *A of the signal A, the inverted signal *B of the signal B and the signal C are inputted to the fourth NOR circuit NR4. The signal A, the signal B and the inverted signal *C of the signal C are inputted to the fifth NOR circuit NR5. The inverted signal *A of the signal A, the signal B and the inverted signal *C of the signal C are inputted to the sixth NOR circuit NR6.

Viewed from the signal C, regardless of the states of the signals A and B, the three-input NOR circuit, the first input of which is in a high state and the second input of which is in a high state, the three-input NOR circuit, the first input of which is in a high state and the second input of which is a low state, the three-input NOR circuit, the first input of which is a low state and the second input of which is in a high state, and the three-input NOR circuit, the first input of which is a low state and the second input of which is in a low state, serve as loads. When the inverted signal *C of the signal C is generated by an inverter, the inverter capacitance is added thereto. As a result, the input pin capacitance of the input C is always held to be constant. This is the same with respect to the input B. However, with respect to the signal A, the three NOR circuits are only connected, so that the input capacitance viewed from the signal A varies in accordance with the states of the signals B and C.

Since the output of the three-input NOR circuit is now originally required, the output of the first NOR circuit NR1 is connected to a circuit in the next stage. It is herein more effective that the output loads of the second through sixth NOR circuits NR2 through NR6 are the same as that of the first NOR circuit. It is also effective that the circuit parameters of the first through sixth NOR circuits NR1 through NR6 approximate to each other. While the three-input NOR circuits have been used in the tenth preferred embodiment, the present invention may be applied to other three-input logic circuits.

By using the tenth preferred embodiment of a semiconductor integrated circuit device according to the present invention, it is possible to prevent the input capacitances of all of the input pins of a three-input logic circuit from being influenced by the state of another input signal.

Eleventh Preferred Embodiment

Figure 13:
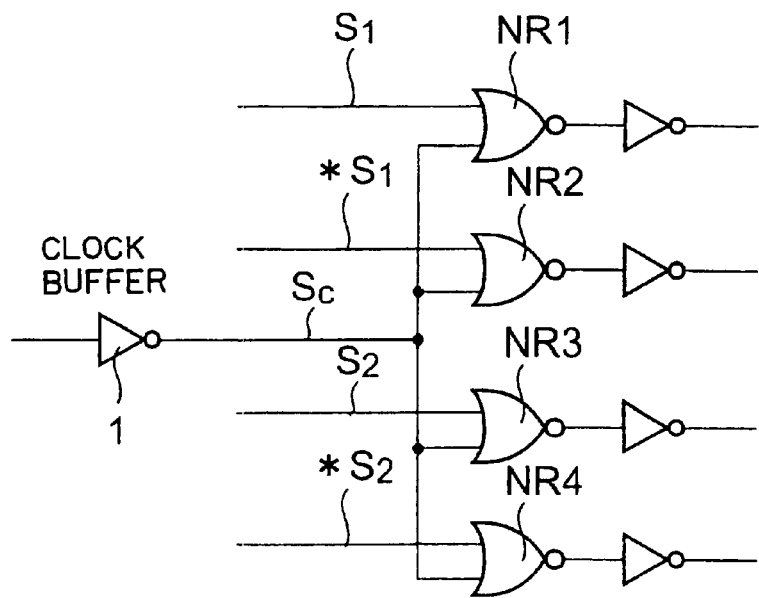
FIG. 13 is a circuit diagram showing the construction of the eleventh preferred embodiment of a semiconductor integrated circuit device according to the present invention.

FIG. 13 is a circuit diagram showing the construction of the eleventh preferred embodiment of a semiconductor integrated circuit device according to the present invention. The semiconductor integrated circuit device in the eleventh preferred embodiment shown in FIG. 13 comprises first through fourth two-input NOR circuits NR1, NR2, NR3 and NR4 for inputting a clock signal Sc which is outputted from a clock buffer 1. A clock control signal S1 is inputted to the first NOR circuit NR1, and the inverted signal *S1 of the clock control signal S1 is inputted to the second NOR circuit NR2. A clock control signal S2 is inputted to the third NOR circuit NR3, and the inverted signal *S2 of the clock control signal S2 is inputted to the fourth NOR circuit NR4. If it is used as the clock signals of the first and third NOR circuits NR1 and NR3, it is controlled whether clocks are transmitted in accordance with the clock control signals S1 and S2.

Viewed from the clock buffer 1, the other input signal S1 of the first NOR circuit NR1 is complementary to the other input signal *S1 of the second NOR circuit NR2, so that it has a constant load regardless of the state of the clock control signal. This is the same with respect to the third and fourth NOR circuits NR3 and NR4. As a result, the load of the clock buffer 1 can be constant regardless of the states of the control signals S1 and S2.

In order to obtain a more effective construction, the circuit parameters of the first and second NOR circuits NR1 and NR2 are preferably the same, and the circuit parameters of the third and fourth NOR circuits NR3 and NR4 are preferably the same. It is also effective that the output load of the second NOR circuit NR2 is equal to the output load of the first NOR circuit NR1 and that the output load of the fourth NOR circuit NR4 is equal to the output load of the third NOR circuit NR3.

While the two-input NOR circuits have been used in the eleventh preferred embodiment, the present invention may be applied to other two-input logic circuits. The present invention may also be applied to a case where the kinds of the logic circuits to which the control signals S1 and S2 are inputted are different.

In the eleventh preferred embodiment, the inverted signals *S1 and *S2 of the clock control signals S1 and S2 may be generated by inverters, respectively. In addition, if an inverted signal has been generated at some place in the whole circuit construction, it is not required to newly generate signals if the inverted signal is used as it is.

According to the semiconductor integrated circuit device in the eleventh preferred embodiment, it is possible to prevent a gated clock signal from being influenced by the state of a signal for controlling a gated clock signal which is supplied to another block.

Twelfth Preferred Embodiment

Figure 14:
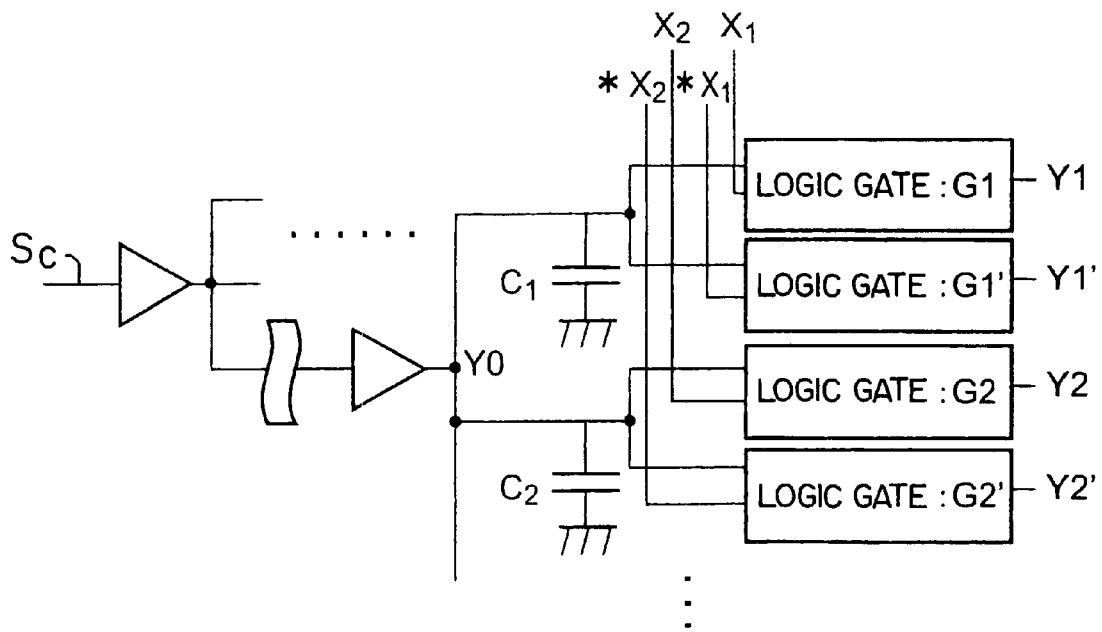
FIG. 14 is a circuit diagram showing the construction of the twelfth preferred embodiment of a semiconductor integrated circuit device according to the present invention.

Referring to FIG. 14, the twelfth preferred embodiment of a semiconductor integrated circuit device according to the present invention will be described below. In the twelfth preferred embodiment, the present invention is applied to a clock tree. Signal Sc denotes a clock signal. In addition, Y0 denotes a signal in a clock tree, and X1, X2, . . . denote control signals for preparing clock signals Y1, Y2, . . . which are controlled by logic gates G1, G2, . . . . As shown in FIG. 14, if logic gates G1, G1', G2, G2., are designed to have X1, *X1, X2, *2, . . . and Y0 in the clock tree as inputs, input capacitances Cl, C2, from Y0 can be constant regardless of the states of the signals X1, X2, . . . . If necessary, Y1' and Y2' may be used.

Thus, by using the twelfth preferred embodiment of a semiconductor integrated circuit device according to the present invention, it is possible to control the variation in delay time (skew, jitter) of clock signals which are controlled by control signals and logic gates.

Thirteenth Preferred Embodiment

Figure 15:
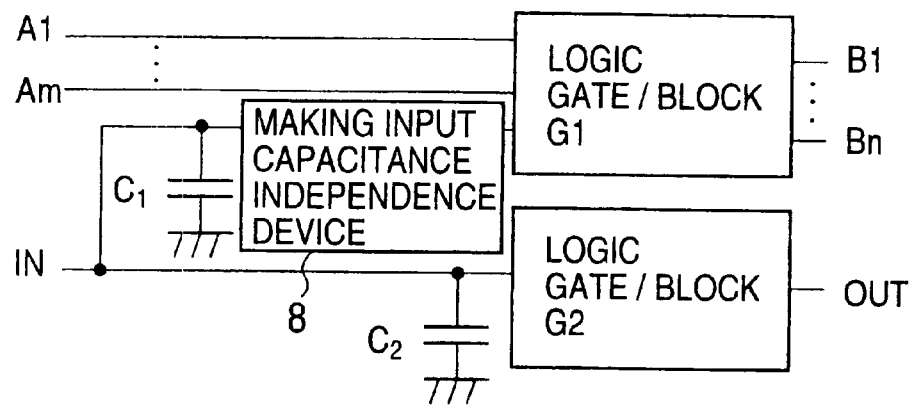
FIG. 15 is a block diagram showing the construction of the thirteenth preferred embodiment of a semiconductor integrated circuit device according to the present invention.

Referring to FIG. 15, the thirteenth preferred embodiment of a semiconductor integrated circuit device according to the present invention will be described below. In this thirteenth preferred embodiment, by inserting a making input capacitance independence device 8 into a multi-input logic gate or a block G1 comprising the multi-input logic gate, the input capacitance C1 to the block G1 can depend on the states of inputs A1 through Am. From the logic gate or block G1, outputs B1 through Bn are outputted. A logic gate or block G2 is a logic gate or block wherein an input capacitance C2 is constant. In this case, an input capacitance (C1+C2) is constant, so that the delay time from an input in to an output out can be constant regardless of the states of the inputs A1 through Am.

By using the thirteenth preferred embodiment of a semiconductor integrated circuit device according to the present invention, with respect to inputs supplied to the making input capacitance independence device 8, the input capacitance is constant regardless of the states of all of other inputs of one logic gate or block, which are inputted via the making input capacitance independence device.

Fourteenth Preferred Embodiment

Figure 16:
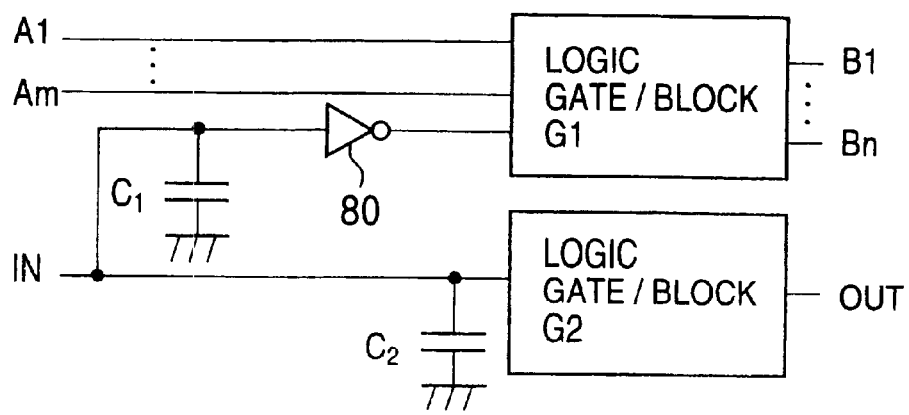
FIG. 16 is a block diagram showing the construction of the fourteenth preferred embodiment of a semiconductor integrated circuit device according to the present invention.

Referring to FIG. 16, the fourteenth preferred embodiment of a semiconductor integrated circuit device according to the present invention will be described below. As shown in FIG. 16, in this fourteenth preferred embodiment, the making input capacitance independence device 8 in the thirteenth preferred embodiment comprises an inverter 80. Other constructions are the same as those in FIG. 15, so that duplicated descriptions are omitted.

By using the fourteenth preferred embodiment of a semiconductor integrated circuit device according to the present invention, with respect to inputs connected to the making input capacitance independence device, the input capacitance can be constant regardless of the states of all of other inputs of a logic gate or block, which are inputted via the making input capacitance independence device.

Fifteenth Preferred Embodiment

Figure 17:
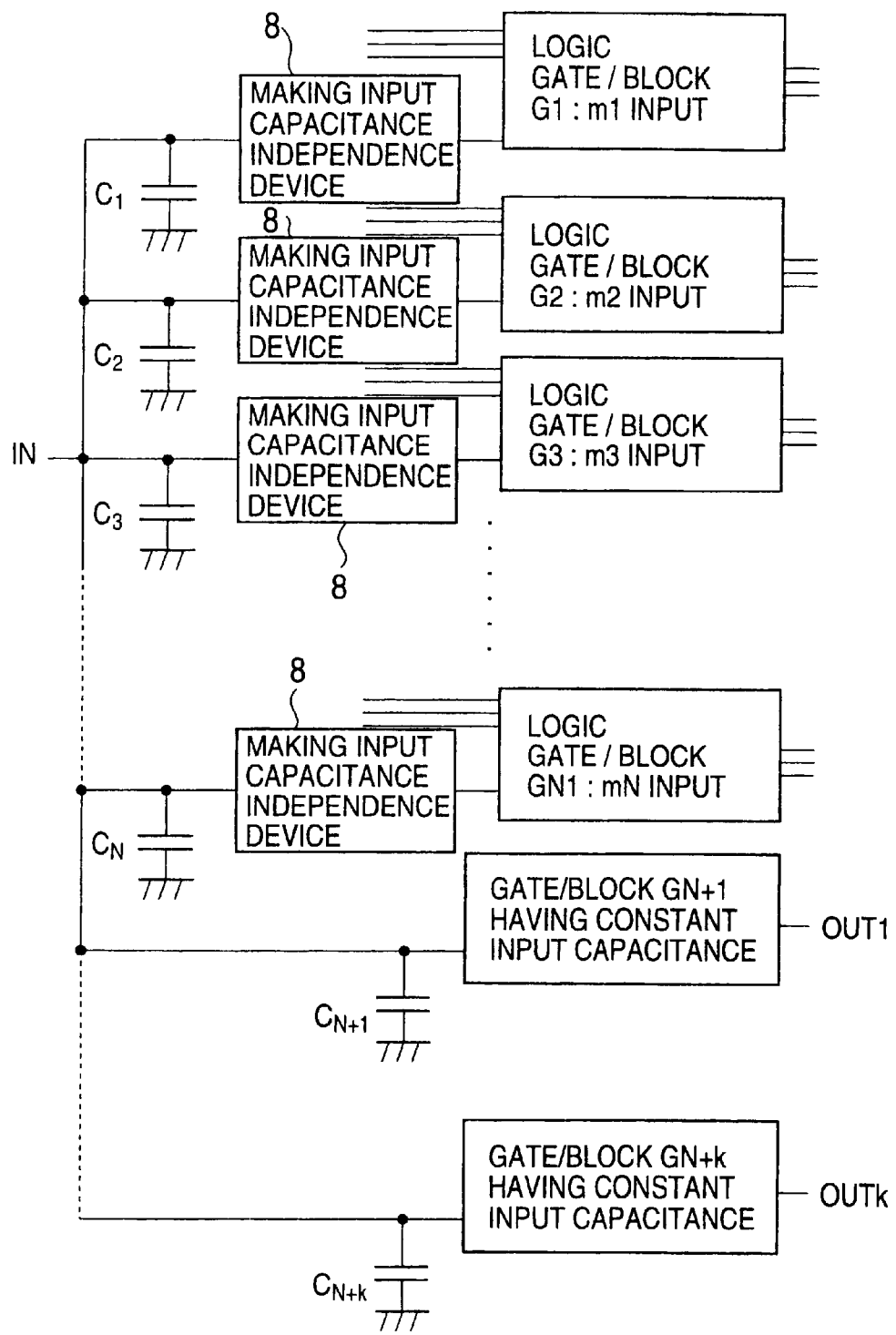
FIG. 17 is a block diagram showing the construction of the fifteenth preferred embodiment of a semiconductor integrated circuit device according to the present invention.

Referring to FIG. 17, the fifteenth preferred embodiment of a semiconductor integrated circuit device according to the present invention will be described below.

In FIG. 17, if inputs in are inputted to all of making input capacitance independence devices 8, or logic gates or blocks having a constant input capacitance, the input capacitances (Ci) of the inputs in can be constant without depending on the states of all of inputs other than the inputs in of gates G1 through GN. In this case, the delays from the inputs in to the outputs of the making input capacitance independence devices 8, and the delays from the inputs in to the outputs (out 1 through out k) of the gates or blocks are not influenced by the states of the input signals of other logic gates or blocks. There are some cases where there are no logic gates or blocks having a constant input capacitance.

By using the fifteenth preferred embodiment of a semiconductor integrated circuit device according to the present invention, with respect to inputs connected to the making input capacitance independence devices, the input capacitance is constant regardless of the states of all of other inputs of all of logic gates or blocks, which are inputted via the making input capacitance independence devices.

Sixteenth Preferred Embodiment

Figure 18:
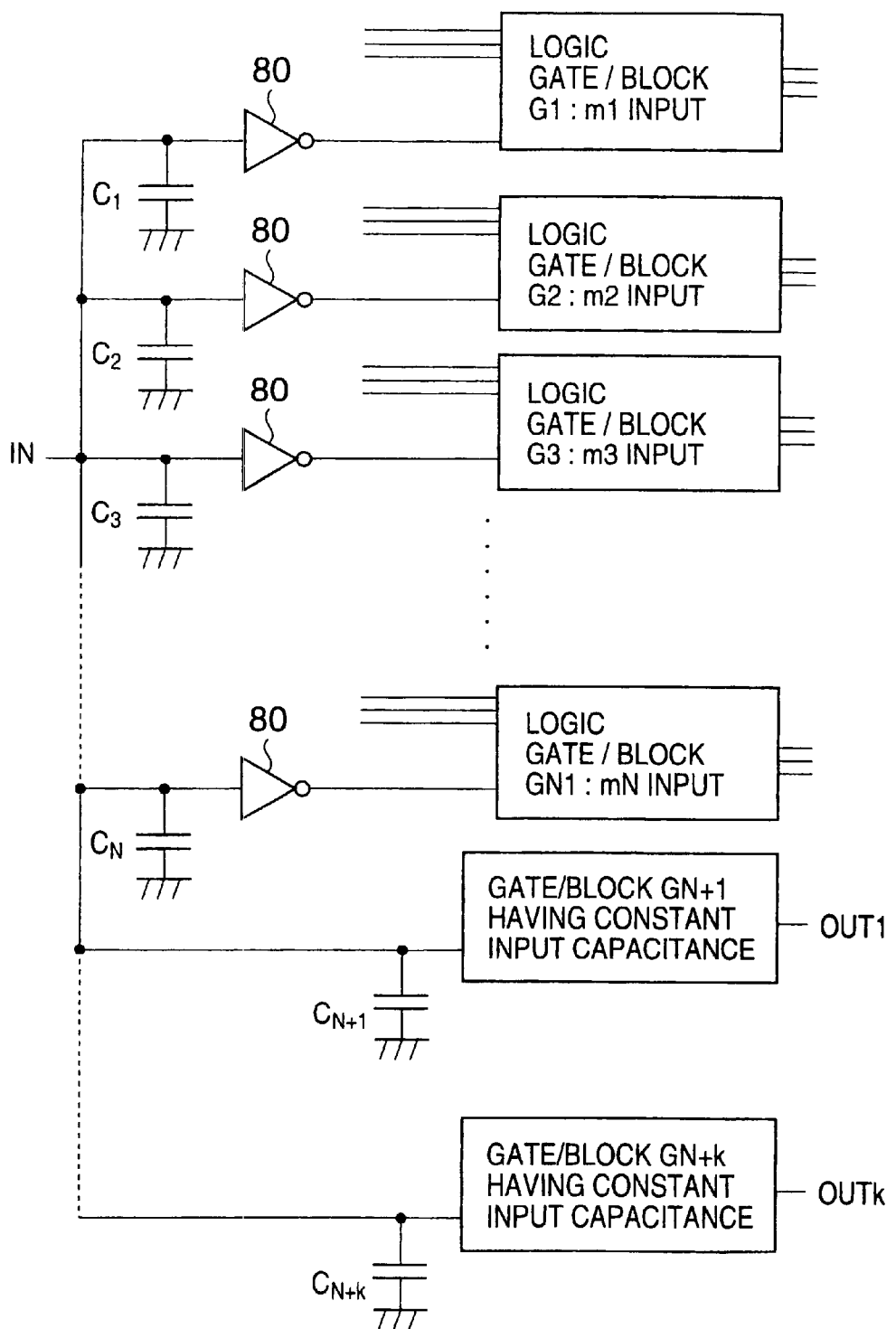
FIG. 18 is a block diagram showing the construction of the sixteenth preferred embodiment of a semiconductor integrated circuit device according to the present invention.

Referring to FIG. 18, the sixteenth preferred embodiment of a semiconductor integrated circuit device according to the present invention will be described below.

As shown in FIG. 18, in the sixteenth preferred embodiment, the making input capacitance independence devices in the fifteenth preferred embodiment are realized by inverters 80. Also with such a construction, the input capacitance of the input in can be constant. Other constructions are the same as those in FIG. 16, so that duplicated descriptions are omitted.

By using the sixteenth preferred embodiment of a semiconductor integrated circuit device according to the present invention, with respect to the inputs connected to the making input capacitance independence devices, the input capacitance is constant regardless of the states of all of the inputs of all of logic gates or blocks, which are inputted via the making input capacitance independence devices.

Seventeenth Preferred Embodiment

Figure 2:
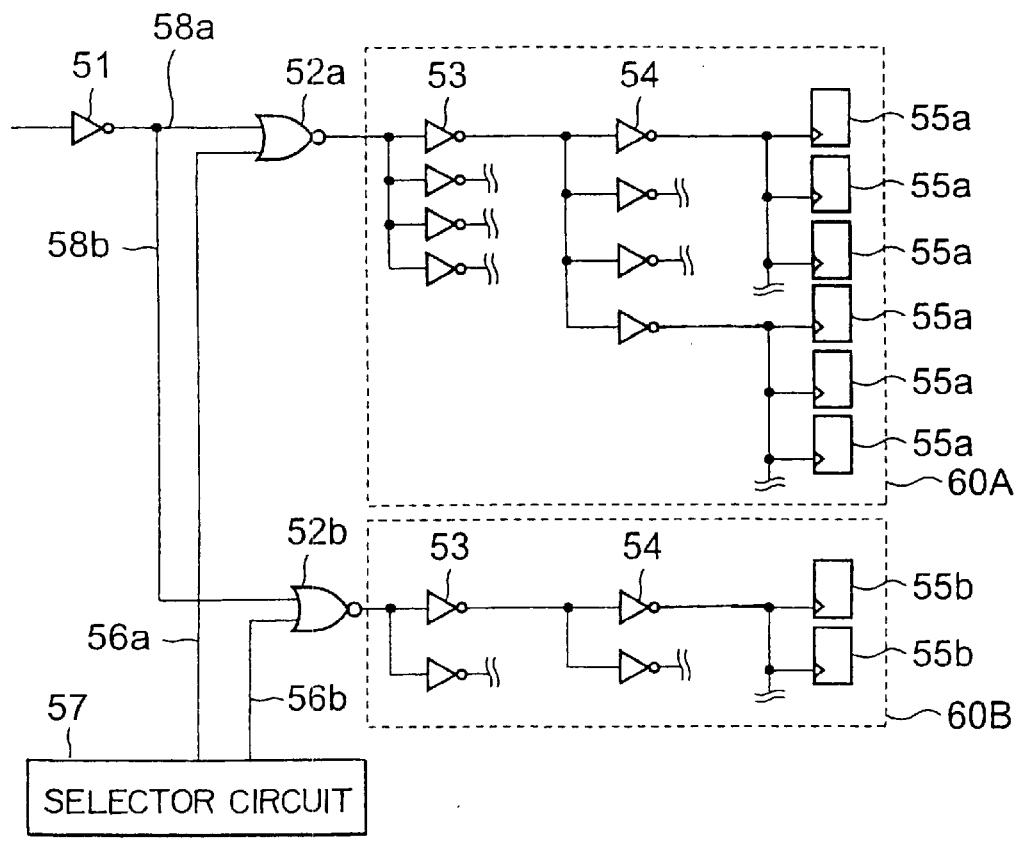
FIG. 2 is a circuit diagram showing the construction of a conventional semiconductor integrated circuit device.

As shown in FIG. 2, in the conventional gated clock circuit, the output of the clock buffer 51 is inputted directly to the two-input NOR circuit. In the seventeenth preferred embodiment, buffer circuits 6a and 6b are inserted into input pins for clock signals with respect to all of multi-input logic circuits to which clock signals are inputted. With such a construction, the circuit shown in, e.g., FIG. 2, is a circuit shown in FIG. 19A.

Since the capacitances of the two buffer circuits 6a and 6b only appear from a root buffer 51, it does not depend on the states of the outputs 56a and 56b of a selector circuit 57. As a result, the timing in inputting clocks to flip-flops 55a is not influenced by the output 56b, and the timing in inputting clocks to the flip-flops 55b is not influenced by the output 56a. If the clock signal is inverted by the inserted buffer circuits 6a and 6b, it can be achieved after NOR circuits 52a and 52b. In this preferred embodiment, this is adjusted by providing another buffer circuit 7 downstream of each of buffer circuits 54.

By using the seventeenth preferred embodiment of a semiconductor integrated circuit device according to the present invention, the timing in inputting a clock signal to the flip-flop 55a or 55b belonging to a certain block is not influenced by the state of a signal for controlling a clock signal which is supplied to another block.

Figure 19A:
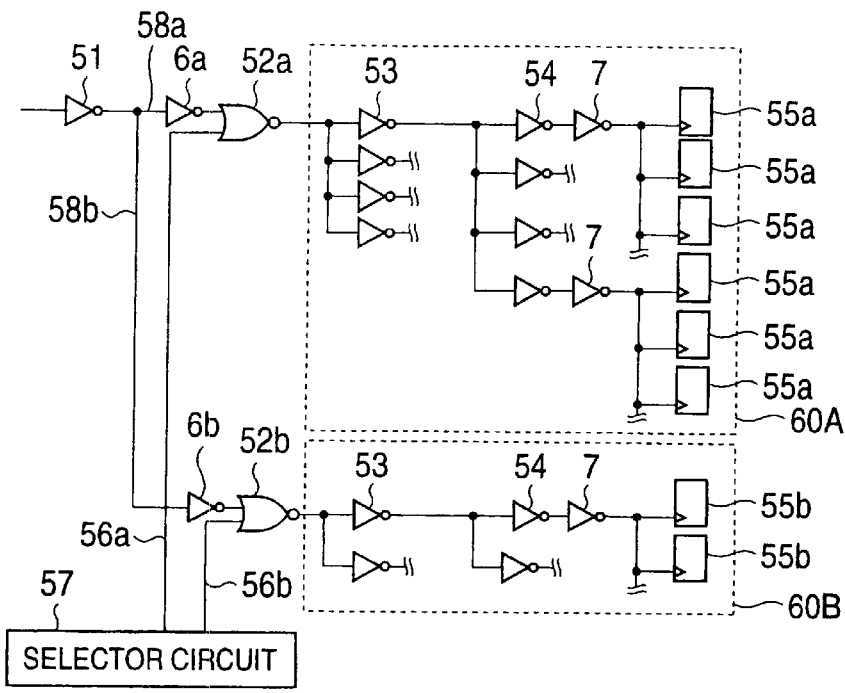
FIG. 19A is a circuit diagram showing the construction of the seventeenth preferred embodiment of a semiconductor integrated circuit device according to the present invention.
Figure 19B:
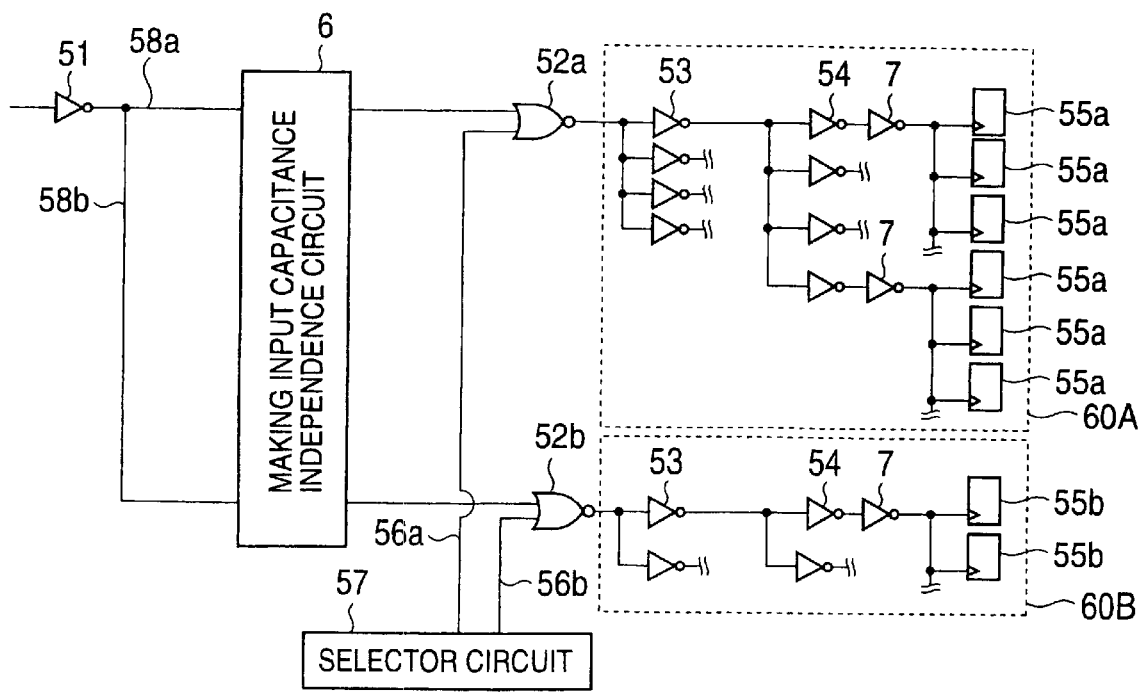
FIG. 19B is a circuit block diagram showing a part of FIG. 19A by a block.

While the circuit of FIG. 19A has been shown so as to correspond to FIG. 2 and while the buffer circuits 6a and 6b have been provided as the making input capacitance independence device in FIG. 19A, the construction of FIG. 19B expressed as FIG. 15 corresponding to FIG. 16 may be used. In FIG. 19B, a making input capacitance independence circuit 6 is provided upstream of the input of one of NOR circuits 52 and 52b. Thus, the making input capacitance independence circuit 6 may comprise elements other than two buffer circuits 6a and 6b. Furthermore, in the present embodiments, buffer circuits 7 are connected to each of outputs of the buffer circuits 54, respectively, so that the adjustment is performed in the manner that a clock input timing to the flip-flops 55a is not influenced by the outputs 56b, and a clock input timing to the flip-flops 55b is not influenced by the outputs 56a.

Eighteenth Preferred Embodiment

Figure 20:
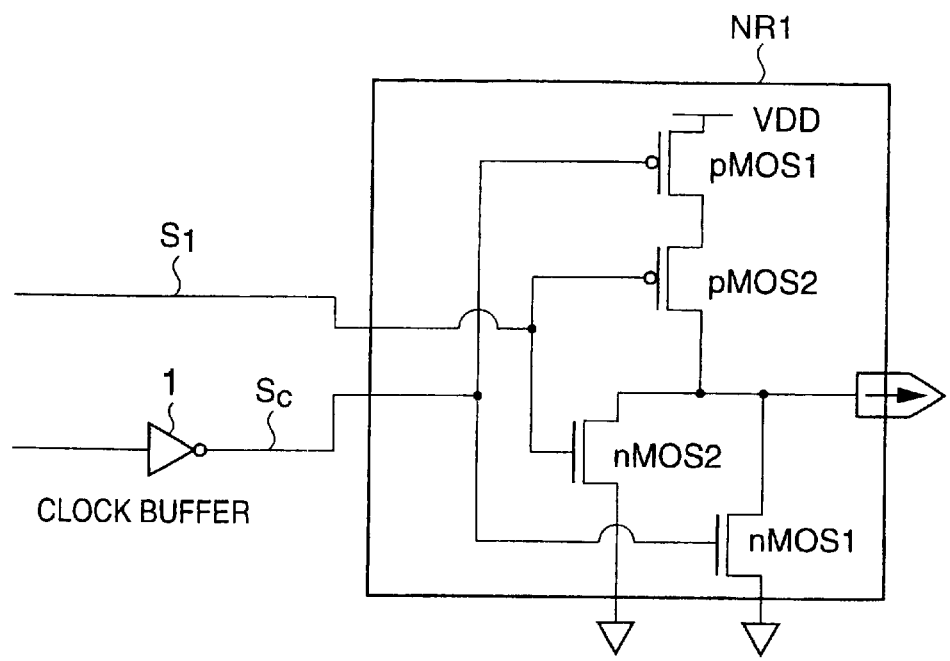
FIG. 20 is a circuit diagram showing the construction of the eighteenth preferred embodiment of a semiconductor integrated circuit device according to the present invention.

Referring to FIG. 20, the eighteenth preferred embodiment of a semiconductor integrated circuit device according to the present invention will be described below.

The semiconductor integrated circuit device in the eighteenth preferred embodiment has the detailed construction of the NOR circuit NR1 of FIG. 13. In FIG. 20, a clock signal SC outputted from a clock buffer 1 is inputted to a two-input NOR circuit (NR1). A clock control signal S1 is inputted to the NOR circuit NR1. The output signal of the NOR circuit NR1 is used as a clock signal. In accordance with the clock control signal S1, it is controlled whether a clock is transmitted or not.

The clock signal SC is inputted to a pMOS1, which is connected directly to a power supply VDD, and an NMOS1. The clock control signal S1 is inputted to a pMOS2 and an nMOS2. By such connections, the input pin capacitance of the NOR circuit NR1 viewed from the clock buffer 1 is difficult to be influenced by the high or low state of the clock control signal S1. Also with respect to the second through fourth NOR circuits NR2 through NR4 shown in FIG. 13, the same circuit construction as that of FIG. 20 can be applied. However, the fourth NOR circuit NR4 may be omitted.

By using the eighteenth preferred embodiment of a semiconductor integrated circuit device according to the present invention, the input pin capacitance of the clock signal input pin of the two-input NOR circuit can be difficult to be influenced by the state of the signal of the control input.

Nineteenth Preferred Embodiment

Figure 21:
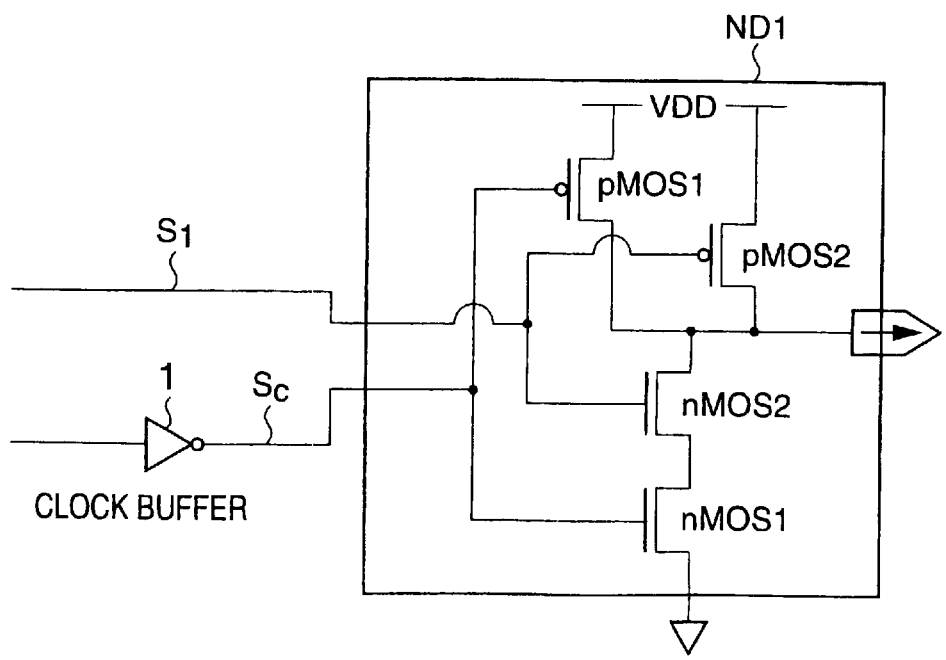
FIG. 21 is a circuit diagram showing the construction of the nineteenth preferred embodiment of a semiconductor integrated circuit device according to the present invention.

Referring to FIG. 21, the nineteenth preferred embodiment of a semiconductor integrated circuit device according to the present invention will be described in detail below.

A clock signal SC outputted from a clock buffer 1 is inputted to a two-input NAND circuit ND1, and a clock control signal S1 is also inputted to the NAND circuit ND1. The output signal of the NAND circuit ND1 is used as a clock signal. In accordance with the clock control signal S1, it is controlled whether a clock is transmitted or not. The clock signal SC is inputted to a pMOS1 and an nMOS1 which is connected directly to the ground GND. The clock control signal S1 is inputted to a pMOS2 and an nMOS2.

By such connections, the input pin capacitance of the NAND circuit ND1 viewed from the clock buffer 1 is difficult to be influenced by the high or low state of the clock control signal SC.

By using the nineteenth preferred embodiment of a semiconductor integrated circuit device according to the present invention, the input pin capacitance of the clock signal input pin of the two-input NAND circuit can be difficult to be influenced by the state of the signal of the control input.

Twentieth Preferred Embodiment

Figure 22:
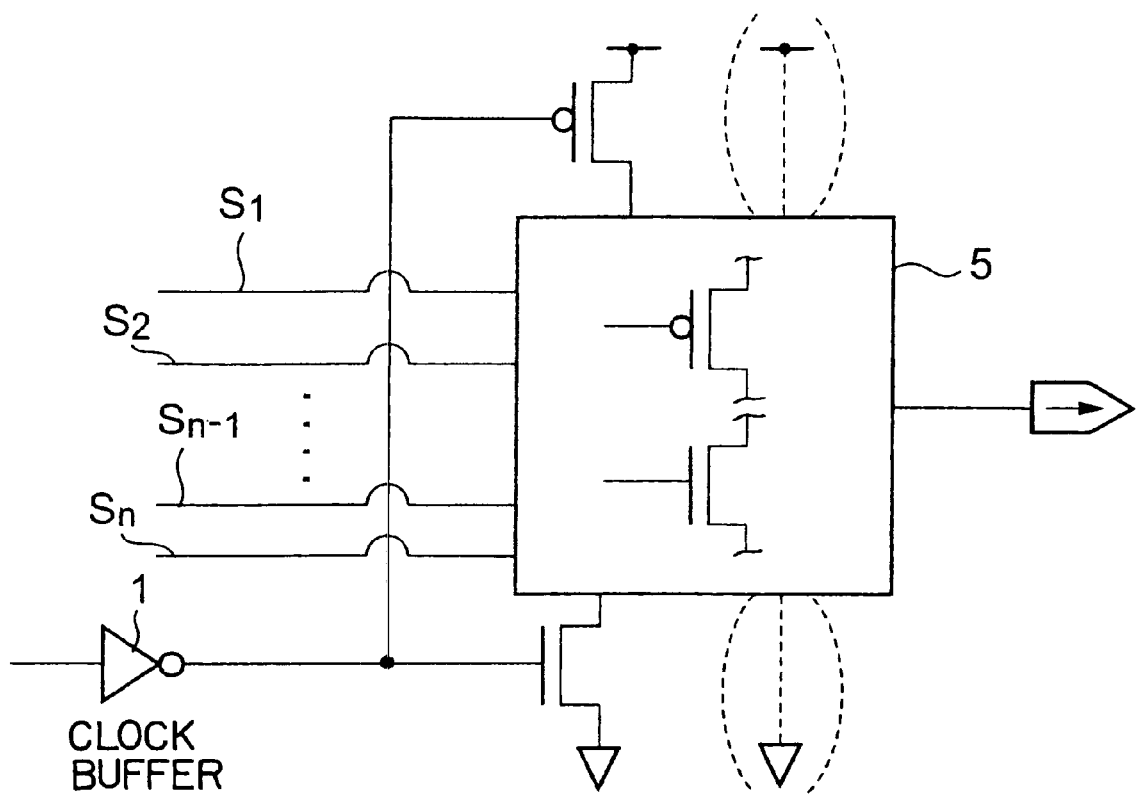
FIG. 22 is a circuit diagram showing the construction of the twentieth preferred embodiment of a semiconductor integrated circuit device according to the present invention.

Referring to FIG. 22, the twentieth preferred embodiment of a semiconductor integrated circuit device according to the present invention will be described below. The twentieth preferred embodiment is an example where the eighteenth or nineteenth preferred embodiment is applied to a typical multi-input logic circuit 5. When the multi-input logic circuit 5 is used for controlling clocks by constructing a clock tree for gated clock, a pMOS for inputting a clock signal is connected directly to a VDD power supply, and an NMOS for inputting a clock signal is connected directly to a GND potential, in order to form a logic necessary for the multi-input logic circuit 5.

By using the twentieth preferred embodiment of a semiconductor integrated circuit device according to the present invention, the input pin capacitance of the clock signal input pin of the multi-input logic circuit can be difficult to be influenced by the state of the signal of the control input.

As described in detail above, according to the semiconductor integrated circuit device of the present invention, in a logic circuit which has a plurality of inputs and wherein the signal states of the plurality of inputs are different to cause the difference in capacitance between their input pins, one or more of the inputs of the logic circuit having the plurality of inputs are provided with a capacitance equalizing circuit for fixing the input capacitance of the input(s) regardless of the states of the plurality of inputs. Therefore, the input pin capacitance of the multi-input logic gate can be constant regardless of the state of another input signal, the delay time of the signal propagated in the integrated circuit can be precisely estimated, and all of delay times between logic elements provided in a plurality of stages or in parallel can be coincident with each other.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor integrated circuit device capable of generating an output without being influenced by the other input, said semiconductor integrated circuit device comprising:

a logic circuit designed to process a predetermined logical operation on the basis of an input signal; and an input capacitance equalizing circuit designed to equalize an input capacitance of said logic circuit, wherein said logic circuit comprises a first logic circuit for carrying out a predetermined logical operation on the basis of a first input signal, and a second logic circuit for carrying out a predetermined logical operation on the basis of at least a second input signal, and said first input signal is inputted to said input capacitance equalizing circuit; and wherein said first logic circuit has one or a plurality of the same circuit constructions which are operated by said first input signal, said second logic circuit has one or a plurality of the same circuit constructions to which one or plurality of second input signals and an output signal outputted from said input capacitance equalizing circuit are inputted, and said input capacitance equalizing circuit comprises a making input capacitance independence circuit for equalizing the input capacitance of said first input signal without depending on the state of said second input signals.

2. A semiconductor integrated circuit device as set forth in claim 1, wherein said first logic circuit comprises a gate block having a constant input capacitance for carrying out a predetermined logical operation on the basis of said first input signal, and said second logic circuit comprises a plurality of logic gate blocks to which a plurality of second input signals and the output of said making input capacitance independence circuit are outputted.

3. A semiconductor integrated circuit device as set forth in claim 2, wherein said making input capacitance independence device comprises an inverter.

4. A semiconductor integrated circuit device as set forth in claim 1, wherein said first and second logic circuits comprise two-input, one-output logical operating elements having the same construction for carrying out a predetermined logical operation, and wherein a selector signal is supplied from a selector circuit to one input of said logical operating elements, and a clock signal which is outputted from said making input capacitance independence circuit, is supplied to the other input.

5. A semiconductor integrated circuit device as set forth in claim 4, wherein said making input capacitance independence circuit comprises a clock buffer for supplying a clock signal to logical operating elements serving as said first and second logical circuits.

* * * * *